(12) United States Patent
Geren et al.

(10) Patent No.: US 7,705,591 B2
(45) Date of Patent: Apr. 27, 2010

(54) RADIO FREQUENCY SENSOR SYSTEMS, ELECTROMAGNETIC SENSOR ARRAYS, AND METHODS OF MANUFACTURE

(75) Inventors: William P. Geren, Shoreline, WA (US); Robert J. Miller, Falls City, WA (US)

(73) Assignee: The Boeing Company, Chicago, IL (US)

( * ) Notice: Subject to any disclaimer, the term of this patent is extended or adjusted under 35 U.S.C. 154(b) by 377 days.

(21) Appl. No.: 11/772,004

(22) Filed: Jun. 29, 2007

(65) Prior Publication Data

US 2009/0001980 A1 Jan. 1, 2009

(51) Int. Cl.
*G01R 33/09* (2006.01)
(52) U.S. Cl. .................................. 324/252; 324/207.21
(58) Field of Classification Search ............ 324/207.21, 324/249, 252; 360/313–316, 324–327
See application file for complete search history.

(56) References Cited

U.S. PATENT DOCUMENTS

| | | | | |
|---|---|---|---|---|
| 3,636,767 | A * | 1/1972 | Duffy | 73/861.77 |
| 5,600,242 | A | 2/1997 | Hubbell | |
| 6,384,600 | B1 | 5/2002 | Coehoorn | |
| 6,924,639 | B2 | 8/2005 | Uenoyama | |
| 7,173,413 | B2 * | 2/2007 | Kurumado | 324/207.21 |
| 2008/0309331 | A1 * | 12/2008 | Qian et al. | 324/252 |

OTHER PUBLICATIONS

Magnetic Field Microsensor Arrays STJA, www.micromagnetics.com/product_page_stjarrays.html, 1 page.
Magnetic Field Microsensor Applications, www.micromagnetics.com/application.html, 1 page.
SpinTJ Series Magnetic Field Microsensors Broshure, http://www.micromagnetics.com/docs/SpinTJ_microsensors_brochure_v2.pdf, 8 pages.
Tondra et al., "Picotesla field sensor design using spin-dependent tunneling devices", Journal of Applied Physics, vol. 83, No. 11, Jun. 1, 1998, pp. 6688-6690.

* cited by examiner

*Primary Examiner*—Bot L LeDynh
(74) *Attorney, Agent, or Firm*—Yee & Associates, P.C.; Charles S. Gumpel

(57) ABSTRACT

An embodiment includes a radio frequency (RF) sensor system having a plurality of magnetoresistive (MR) sensors, where each MR sensor includes a configuration of MR elements and is adapted to produce a time-varying output voltage in response to a time-varying, external magnetic field. The RF sensor system also includes combiner circuitry, electrically coupled to the plurality of MR sensors, and adapted to receive and combine a plurality of time-varying output voltages from the plurality of MR sensors to generate a sensor output voltage. Another embodiment includes an electromagnetic sensor array having a plurality of MR sensors arranged in an array configuration, where each MR sensor includes a plurality of MR elements forming a Wheatstone bridge circuit, and where each MR sensor is adapted to produce a time-varying output voltage in response to a time-varying, external magnetic field. Still another embodiment includes a method for manufacturing an electromagnetic sensor array.

20 Claims, 5 Drawing Sheets

RADIO FREQUENCY SENSOR SYSTEMS, ELECTROMAGNETIC SENSOR ARRAYS, AND METHODS OF MANUFACTURE

TECHNICAL FIELD

Embodiments described herein generally relate to radio frequency (RF) sensor systems and electromagnetic sensor arrays, and more particularly to RF sensor systems and electromagnetic sensor arrays that include magnetoresistive elements, and methods of their manufacture and operation.

BACKGROUND

Radio frequency (RF) electronics systems are commonly used for communications, radar threat warning, direction finding, and other applications. Many RF electronics systems specify limits on the weight, dimensions, and physical profile of their associated antenna systems. For example, mobile platforms (e.g., airborne, vehicle-borne, and human-borne platforms) may particularly specify strict limits on the physical characteristics of an antenna and other system components associated with the antenna, such as support structures and processing electronics. The physical characteristics of an antenna may vary greatly, depending on the particular antenna technology used, the bandwidth that the antenna is designed to support, and other factors. In airborne platforms, for example, commonly used antenna technologies include phased array antenna systems, surface acoustic wave (SAW) based antenna systems, and monopole or slot antenna systems.

An antenna system typically includes the antenna element, itself, along with associated mounting and support structures and processing electronics. An antenna system may also consist of an array of antenna elements arranged in a planar configuration for increased gain and directivity. RF energy may be received via "slots" associated with the antenna array. When used in conjunction with an airborne platform, the slots may be formed through a surface of the aircraft "skin" or outer covering. To achieve reasonable performance, the in-plane dimensions of each receiving antenna element typically are selected to have a size of at least one-half wavelength of the lowest frequency limit of the intended bandwidth. Accordingly, given a fixed number of antenna elements, the overall dimensions of an array antenna increases as the lower bandwidth limit increases. These characteristics of array antennas makes them unsuitable or non-optimal for some platforms having restrictive antenna weight and size specifications, as well as for platforms in which interruptions (e.g., slots) in the outer surface may be undesirable. These restrictions become more severe at lower frequencies, such as frequencies in a range of about 1 to 100 Megahertz (MHz).

Other types of systems may include a ground plane, which is adapted to carry currents produced from RF energy incident upon the ground plane. In some of these systems, antennas may couple to the system's ground plane (e.g., a portion of an aircraft's outer covering), and may draw power from induced currents flowing in the ground plane. These types of systems may include, for example, surface acoustic wave (SAW) devices and/or monopole (or slot) antennas, which are positioned above and in contact with the ground plane (or formed by an opening in the ground plane, with a backing cavity). Although these types of antennas are suitable for use on some platforms, they also may be unsuitable or non-optimal for others. For example, in some cases, the antenna profile above the ground plane may cause undesirable effects (e.g., decreased aerodynamic efficiency).

For the above reasons, it is desirable to provide antenna elements, antennas, and systems that may support a wider range of bandwidths while having physical dimensions and profiles that are within the specifications of restrictive platforms. In addition, it is desirable to provide antenna elements, antennas, and systems that do not include significant physical interruptions in the ground plane (e.g., slots) or require appreciable modification to the structure (e.g., backing cavities or protruding monopole elements). Other desirable features and characteristics of embodiments of the inventive subject matter will become apparent from the subsequent detailed description and the appended claims, taken in conjunction with the accompanying drawings and the foregoing technical field and background.

SUMMARY

An embodiment of the inventive subject matter includes a radio frequency (RF) sensor system having a plurality of magnetoresistive sensors, where each magnetoresistive sensor includes a configuration of magnetoresistive elements and is adapted to produce a time-varying output voltage in response to a time-varying, external magnetic field, and combiner circuitry, electrically coupled to the plurality of magnetoresistive sensors, and adapted to receive and combine a plurality of time-varying output voltages from the plurality of magnetoresistive sensors to generate a sensor output voltage. According to a further embodiment, the configuration of magnetoresistive elements includes a configuration of giant magnetoresistive elements. According to a further embodiment, the configuration of magnetoresistive elements includes a Wheatstone bridge circuit that includes at least four magnetoresistive element forming resistive elements of the Wheatstone bridge circuit. According to a further embodiment, the at least four magnetoresistive elements include at least one shielded magnetoresistive element. According to a further embodiment, the plurality of magnetoresistive sensors includes an array of magnetoresistive sensors. According to a further embodiment, the combiner circuitry is configured to combine at least some of the plurality of time-varying output voltages in series to produce the sensor output voltage.

According to a further embodiment, the RF sensor system also includes an amplifier, electrically coupled to the combiner circuitry, and adapted to amplify the sensor output voltage. According to a further embodiment, the plurality of magnetoresistive sensors are formed on a semiconductor substrate. According to a further embodiment, the RF sensor system also includes a structure, magnetically coupled to the plurality of magnetoresistive sensors, and adapted to carry the time-varying, external magnetic field. According to a further embodiment, the structure includes a conductive mesh structure.

According to a further embodiment, the RF sensor system also includes a conductive ground plane, magnetically coupled to the plurality of magnetoresistive sensors, and adapted to carry the time-varying, external magnetic field in response to an RF signal incident upon the conductive ground plane. According to a further embodiment, the conductive ground plane forms a portion of an outer covering of an aircraft. According to a further embodiment, the plurality of magnetoresistive sensors and the combiner circuitry form a portion of a magnetoresistive sensor array level, and wherein the RF sensor system further includes an exterior layer, coupled to a first side of the magnetoresistive sensor array layer, where the exterior layer is adapted to protect the magnetoresistive sensor array layer, a contact layer, coupled to a second side of the magnetoresistive sensor array layer, where the contact layer is adapted to electrically insulate the magnetoresistive sensor array layer, and an adhesive layer, coupled to the contact layer, where the adhesive layer is adapted to enable the RF sensor system to be adhered to a structure.

Another embodiment includes an electromagnetic sensor array having a plurality of magnetoresistive sensors arranged in an array configuration, where each magnetoresistive sensor includes a plurality of magnetoresistive elements forming a Wheatstone bridge circuit, and where each magnetoresistive sensor is adapted to produce a time-varying output voltage in response to a time-varying, external magnetic field. According to a further embodiment, the Wheatstone bridge circuit includes a first resistance leg having a first unshielded magnetoresistive element and a first shielded magnetoresistive element electrically coupled in series, and a second resistance leg, electrically coupled in parallel to the first resistance leg, and comprising a second unshielded magnetoresistive element and a second shielded magnetoresistive element electrically coupled in series. According to a further embodiment, the electromagnetic sensor array also includes routing circuitry, electrically coupled to output terminals of the plurality of magnetoresistive sensors, and adapted to enable a plurality of time-varying output voltages generated by the plurality of magnetoresistive sensors to be combined. According to a further embodiment, the electromagnetic sensor array also includes combiner circuitry, electrically coupled to the plurality of magnetoresistive sensors, and adapted to receive and combine a plurality of time-varying output voltages from the plurality of magnetoresistive sensors to generate a sensor output voltage. According to a further embodiment, the electromagnetic sensor array also includes an amplifier, electrically coupled to the combiner circuitry, and adapted to amplify the sensor output voltage Yet another embodiment includes a method for manufacturing an electromagnetic sensor array that includes the steps of forming, on a semiconductor substrate, a plurality of magnetoresistive sensors, where each magnetoresistive sensor includes a configuration of magnetoresistive elements and is adapted to produce a time-varying output voltage in response to a time-varying, external magnetic field, and forming routing circuitry, over the plurality of magnetoresistive sensors, where the routing circuitry is electrically coupled to output terminals of the plurality of magnetoresistive sensors, and enables a plurality of time-varying output voltages generated by the plurality of magnetoresistive sensors to be combined. According to a further embodiment, forming the plurality of magnetoresistive sensors includes forming each of the plurality of magnetoresistive sensors as a Wheatstone bridge circuit that includes a first resistance leg comprising a first unshielded magnetoresistive element and a first shielded magnetoresistive element electrically coupled in series, and a second resistance leg, electrically coupled in parallel to the first resistance leg, and comprising a second unshielded magnetoresistive element and a second shielded magnetoresistive element electrically coupled in series. According to a further embodiment, the method also includes packaging the electromagnetic sensor array as a large scale integrated circuit.

BRIEF DESCRIPTION OF THE DRAWINGS

Various embodiments will hereinafter be described in conjunction with the following drawing figures, wherein like numerals denote like elements.

DETAILED DESCRIPTION

The following detailed description is merely exemplary in nature and is not intended to limit the described embodiments or the application and uses of the described embodiments. Furthermore, there is no intention to be bound by any expressed or implied theory presented in the preceding technical field, background, brief summary or the following detailed description.

Embodiments of the inventive subject matter include radio frequency (RF) sensors, sensor arrays, and sensor systems that include magnetoresistive (MR) elements. In an embodiment, the magnetoresistive elements include "giant" magnetoresistive (GMR) elements, although the MR elements may alternatively include "colossal" magnetoresistive elements, "ordinary" magnetoresistive elements, and/or other magnetoresistive elements that exhibit a tunneling magnetoresistive effect. An "MR element," as that term is used herein, includes a thin-film structure having at least two ferromagnetic layers surrounding a non-ferromagnetic layer (e.g., a conducting thin film, such as copper, between two magnetic thin films). Electrical conduction across the non-ferromagnetic layer is the result of quantum-mechanical tunneling, and these structures alternatively may be referred to as magnetic tunneling junctions and/or spin tunneling junctions.

An MR element may have a variable resistance. When the magnetization axes of adjacent ferromagnetic layers are anti-parallel (i.e., oriented with respect to each other at any angle except about 0 degrees), an MR element may be characterized by a relatively higher electrical resistance than when the magnetization axes of the adjacent ferromagnetic layers are parallel. This resistance variation, which is related to the parallel or anti-parallel magnetization states of the ferromagnetic layers' magnetization axes, may be referred to herein as the "MR effect." The resistance variation may be related to the relative angle between the magnetization axes of the ferromagnetic layers. Resistance variations between parallel and anti-parallel magnetization states may be on the order of up to about 20% or more, in some cases, with highest resistances generally occurring when the magnetization axes are approximately anti-parallel, and with the lowest resistances occurring when the magnetization axes are approximately parallel.

Figure 1:
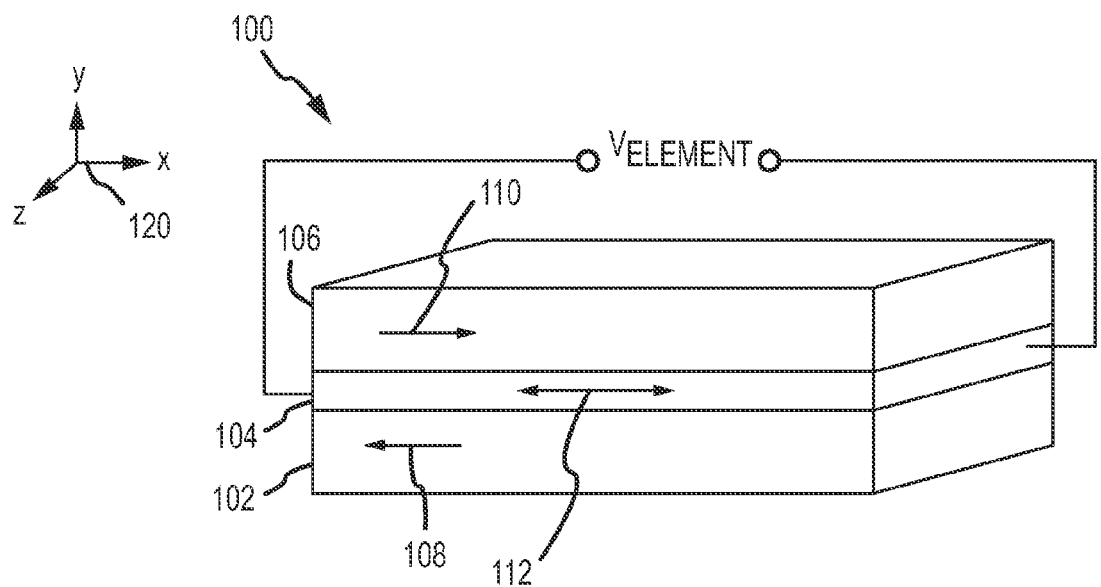
FIG. 1 illustrates a simplified diagram of a magnetoresistive (MR) element having magnetization axes of adjacent ferromagnetic layers in an anti-parallel magnetization state, in accordance with an example embodiment of the inventive subject matter.

FIG. 1 illustrates a simplified diagram of an MR element 100 having magnetization axes of adjacent ferromagnetic layers 102, 106 in an anti-parallel magnetization state, in accordance with an example embodiment of the inventive subject matter. To simplify the description of the operation of MR element 100, all directions will be referenced to an x-, y-, and z-coordinate system 120 as shown.

MR element 100 includes a first ferromagnetic layer 102, a non-ferromagnetic, layer 104 (e.g., a conducting layer), and a second ferromagnetic layer 106, in an embodiment. In other embodiments, one or more additional ferromagnetic layers and/or non-ferromagnetic layers may be included in an MR element. In an embodiment, first magnetic layer 102 is a "pinned" magnetic layer in that its magnetization axis is substantially fixed in orientation. This may be achieved, for example, by positioning first magnetic layer 102 in exchange contact with an adjacent permanent magnetic layer (not illustrated), an anti-ferromagnetic layer (not illustrated), or another structure (not illustrated) that induces the magnetization axes of first magnetic layer 102 to remain at a fixed orientation. In contrast, second magnetic layer 106 is a "free" magnetic layer, in that its magnetic field may rotate, in orientation, based on its exposure to external magnetic fields.

First and second ferromagnetic layers 102, 106 may be referred as "magnetically coupled," as that term is used herein, when they are in a close enough physical proximity to one another that their nuclear magnetic moments are coupled through a phenomenon referred to as RKKY coupling (Ruderman-Kittel-Kasuya-Yosida coupling). First and second ferromagnetic layers 102, 106 may include, for example ferromagnetic layers having thicknesses in a range of 0.5 to 1.5 nanometers (nm), although ferromagnetic layers 102, 106 may be thicker and/or thinner, in other embodiments. First and second ferromagnetic layers 102, 106 may be formed from substantially the same or different materials, including one or more ferromagnetic materials selected from a group of materials that includes, but is not limited to, cobalt (Co), iron (Fe), nickel/iron alloys, and/or combinations thereof.

Non-ferromagnetic layer 104 is adapted to provide a spacer between first and second ferromagnetic layers 102, 106. Non-ferromagnetic layer 104 may include, for example a conductive material layer having a thickness in a range of 1-3 nm, although non-ferromagnetic layer 104 may be thicker or thinner, in other embodiments. Non-ferromagnetic layer 104 may be formed from one or more non-ferromagnetic, conductive materials selected from a group of materials that includes, but is not limited to, copper (Cu) and ruthenium (Ru).

Non-ferromagnetic layer 104 has a thickness in a range of thicknesses that enables RKKY coupling to exist between first and second ferromagnetic layers 102, 106. In an embodiment, non-ferromagnetic layer 104 has a thickness in a range of about 0.2 nm to about 5 nm, although non-ferromagnetic layer 104 may be thinner or thicker, in other embodiments. In an embodiment, non-ferromagnetic layer 104 has a thickness such that the RKKY coupling between first and second ferromagnetic layers 102, 106 becomes anti-ferromagnetic in the absence of a sufficiently strong external magnetic field (e.g., a time-varying, external magnetic field). This means that it is energetically preferable for the magnetization axes of first and second ferromagnetic layers 102, 106 to align in anti-parallel directions in the absence of a sufficiently strong external magnetic field. An MR element may be referred to herein as being in a "neutral magnetization state" when the magnetization axes of the first or second ferromagnetic layers 102, 106 are not rotated by an external magnetic field. An MR element may be referred to herein as being in a "non-neutral magnetization state" when the magnetization axes of the first or second ferromagnetic layers 102, 106 are rotated by an external magnetic field. An MR element may be referred to herein as being in an "anti-parallel magnetization state" when the magnetization axes of its first and second ferromagnetic layers (e.g., layers 102, 106) are aligned in anti-parallel directions (e.g., as illustrated in FIG. 1). An MR element may be referred to herein as being in a "perpendicular magnetization state" when the magnetization axes of an MR element's first and second ferromagnetic layers are oriented perpendicularly to each other. In FIG. 1, the anti-parallel magnetization axes of first and second ferromagnetic layers 102, 106 is indicated by the direction of magnetization arrows 108, 110. In contrast, an MR element may be referred to herein as being in a "parallel magnetization state" when the magnetization axes of its first and second ferromagnetic layers are aligned in substantially parallel directions (e.g., as indicated by arrows 208, 210 in FIG. 2).

MR element 100 is characterized by an electrical resistance, which is variable based on the relative angle between magnetization axes of first and second ferromagnetic layers 102, 106. When a given voltage, $V_{ELEMENT}$, is applied across MR element 100, a current (indicated by bi-directional arrow 112, since the current may be in either direction) may flow through MR element 100. The illustrated configuration is referred to as a "CIP" (current in the plane) type of MR element, in which the current flows in the plane of layers 102, 104, and 106, and the voltage is applied at the ends of MR element 100. In another embodiment, a "CPP" (current perpendicular to plane) type of MR element may be used, in which the current flows perpendicular to the plane of layers 102, 104, and 106, and the voltage is applied at the top and bottom of the MR element. Both types of MR elements exhibit similar behavior when exposed to an external magnetic field. The magnitude of the current across MR element 100 depends on the resistance of MR element 100, and thus on the relative angle between the magnetization axes of the first and second ferromagnetic layers 102, 106. When first and second ferromagnetic layers 102, 106 are in anti-parallel magnetization states, the electrical resistance of MR element 100 is relatively high, when compared with the electrical resistance when first and second ferromagnetic layers 102, 106 are in parallel magnetization states. Accordingly, the magnitude of the current through MR element 100 is smaller when first and second ferromagnetic layers 102, 106 are in anti-parallel magnetization states, when compared with the magnitude of the current when first and second ferromagnetic layers 102, 106 are in parallel magnetization states. In an embodiment, the relative angle (and thus the resistance of MR element 100) of the magnetization axes of first and second ferromagnetic layers 102, 106 may be altered based on exposure of MR element 100 to an external magnetic field (not illustrated in FIG. 1).

Figure 2:
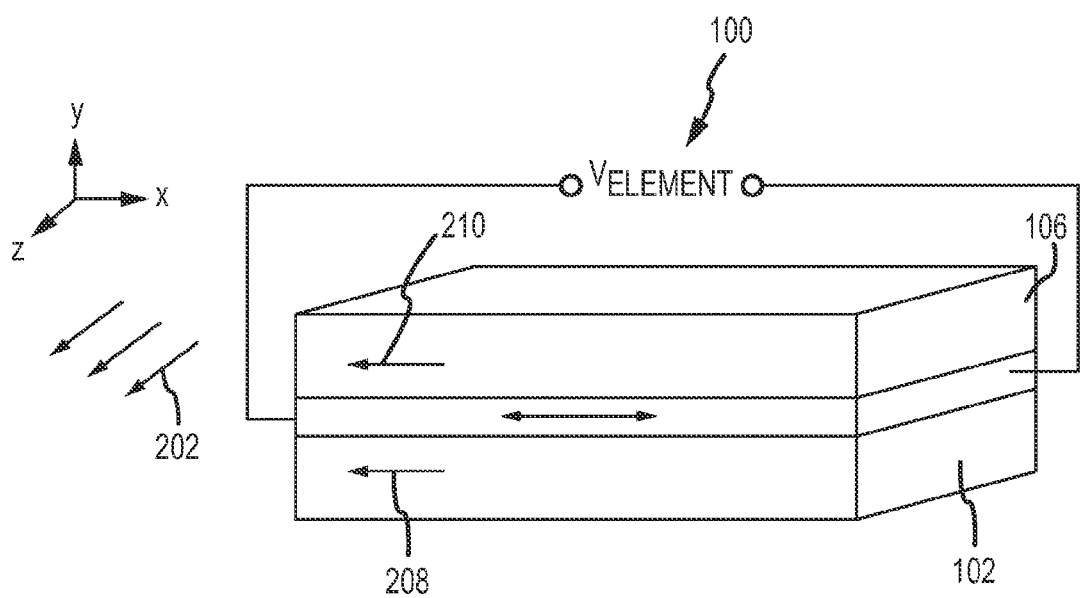
FIG. 2 illustrates a simplified diagram of the MR element of FIG. 1 having magnetization axes of adjacent ferromagnetic layers in a parallel magnetization state, in accordance with an example embodiment.

FIG. 2 illustrates a simplified diagram of the MR element 100 of FIG. 1 having adjacent ferromagnetic layers 102, 106 in a parallel magnetization state, in accordance with an example embodiment. In FIG. 2, an external magnetic field is present, which has a flux direction indicated by arrows 202. For example, the flux direction may be along the negative x-axis, as indicated by arrows 202. When the external magnetic field is sufficiently strong, a magnetization axis of free magnetic layer 106 may rotate to align in approximately a direction parallel to the flux direction of the external magnetic field. The orientation of the magnetization axis of free magnetic layer 106 is indicated by arrow 210, and this direction is approximately parallel to the flux direction of the external magnetic field (e.g., along the negative x-axis). As discussed previously, the resistance of MR element 100 in the parallel state (FIG. 2) may be less than the resistance of MR element 100 in an anti-parallel state (FIG. 1). This may result in a higher current through MR element 100, given the same applied voltage, $V_{ELEMENT}$.

In an embodiment, each MR element (e.g., MR element 100, FIG. 1) may be used in a system as a resistive circuit element, which has a variable resistance that depends on the external magnetic field. As the external magnetic field varies with time, the resistance of the MR element also varies, and a time-varying output voltage may be produced. An "MR sensor," as that term is used herein, includes a configuration of MR elements adapted to produce a time-varying output voltage in the presence of a time-varying, external magnetic field.

Figure 3:
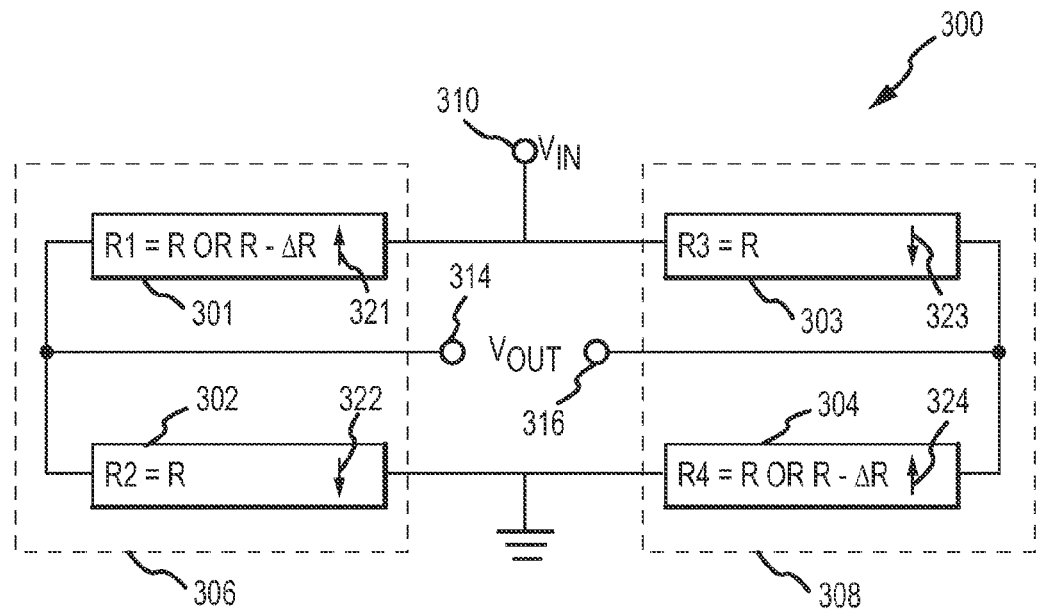
FIG. 3 illustrates a simplified, circuit diagram of an MR sensor, in accordance with an example embodiment.

FIG. 3 illustrates a simplified, circuit diagram of an MR sensor 300, in accordance with an example embodiment. In an embodiment, MR sensor 300 includes four MR elements 301, 302, 303, 304, which are electrically coupled to form a Wheatstone bridge configuration. Accordingly, a first set of two MR elements 301, 302 are electrically coupled in series to form a first resistance leg 306, and a second set of two MR elements 303, 304 are electrically coupled in series to form a second resistance leg 308, where the first leg 306 and the second leg 308 are connected together in parallel. As used herein, the term "electrically coupled" means having a direct electrical connection and/or having an electrical connection through a path that may include one or more conductors and/or electrical components (e.g., discrete components and/or devices).

When an input voltage, $V_{IN}$, is applied across the first and second legs 306, 308 between an input terminal 310 and ground (or some other reference), an output voltage, $V_{OUT}$, is produced between midpoint terminals 314, 316 of the first and second legs 306, 308. According to Kirchhoff's circuit rules, $V_{OUT}$ may be derived according to Equation 1 (Equ. 1) as:

$$V_{OUT} = V_{IN}\left(\frac{R4}{R3+R4} - \frac{R2}{R1+R2}\right) \qquad \text{(Equ. 1)}$$

where R1, R2, R3, and R4 are the resistance values, at any given time, of MR elements 301-304, respectively.

One MR element of each resistance leg 306, 308 is exposed to external magnetic fields, and the other MR element of each resistance leg 306, 308 is shielded from external magnetic fields, in an embodiment. More specifically, in an embodiment, a first pair of MR elements on opposite sides of the midpoints of the first and second resistance legs 306, 308 is exposed to external magnetic fields, and a second pair of MR elements on other opposite sides of the midpoints of the first and second resistance legs 306, 308 is shielded from external magnetic fields. For example, MR elements 301 and 304 may be exposed to external magnetic fields, while MR elements 302 and 303 may be shielded from external magnetic fields. Because the resistance of an MR element may vary based on the external magnetic field, the resistances of MR elements 301 and 304 may vary as a function of the external magnetic field. These MR elements 301, 304 may be referred to herein as "unshielded" MR elements. Conversely, due to the shielding, the resistances of MR elements 302 and 303 may not vary as a function of the external magnetic field. These MR elements 302, 303 may be referred to herein as "shielded" MR elements. In alternate embodiments, different numbers of MR elements and/or different combinations of MR elements may be unshielded or shielded. For example, a single MR element may be unshielded, in an embodiment, while a remainder of the MR elements may be shielded, or vice versa. In still other alternate embodiments, some or all of the shielded MR elements may be replaced with discrete resistors.

In an embodiment, MR elements 301-304 have substantially similar structures, and each MR element 301-304 includes a pinned magnetic layer (e.g., first magnetic layer 102, FIG. 1) and a free magnetic layer (e.g., second magnetic layer 106). In an embodiment, the pinned magnetic layers (e.g., layer 102, FIG. 1) of adjacent MR elements 301-304 have magnetization axes in substantially opposite directions, as indicated by arrows 321, 322, 323, 324. In another embodiment, the pinned magnetic layers of adjacent MR elements 301-304 may be in the same direction.

MR elements 301-304 may have substantially equal resistance values when the relative directions of the magnetization axes of their pinned and free magnetic layers all are in the same states (e.g., perpendicular, anti-parallel or parallel magnetization states). A substantially perpendicular magnetization state is a neutral magnetization state, in an embodiment, although a neutral magnetization state could be another anti-parallel magnetization state or a parallel magnetization state, in other embodiments. Resistance in a neutral magnetization state is represented herein as R, and the maximum variance in the resistance of an MR element between a highest resistance state (e.g., an anti-parallel magnetization state) and a lowest resistance state (e.g., a parallel magnetization state) is represented herein as ΔR. Accordingly, in a parallel magnetization state, the resistance of an MR element 301-304 may be represented as R−ΔR. In an embodiment, the resistance of MR elements 301-304 in a neutral magnetization state is a resistance in a range of about 1 kΩ (kiloOhm) to about 10 kΩ, with a resistance of about 5 kΩ being preferred. In other embodiments, the resistance of MR elements 301-304 may be higher or lower than the above given range.

In an embodiment, when all of MR elements 301-304 are in a neutral magnetization state (e.g., a perpendicular magnetization state), their resistances are substantially equal. According to Equ. 1, when R1, R2, R3, and R4 are substantially equal, then $V_{OUT}$=0 Volts (V). As used herein, a "neutral sensor voltage" refers to an output voltage produced when all MR elements 301-304 are in the same neutral magnetization state (e.g., the angle between the magnetization axes of their pinned and free magnetization layers is substantially equal). When exposed to an external magnetic field that is sufficient to alter the states of unshielded MR elements 301 and 304 away from the neutral magnetization state (e.g., toward a parallel magnetization state), the resistances of unshielded MR elements 301 and 304 may be reduced, and accordingly their resistances become unequal to the resistances of shielded MR elements 302 and 303. For example, when a perpendicular magnetization state is the neutral magnetization state, and when the states of unshielded MR elements 301 and 304 are rotated to a parallel magnetization state, their resistances are reduced to R−ΔR. According to Equ. 1, when unshielded MR elements 301 and 304 are in parallel magnetization states, and shielded MR elements 302 and 303 are in perpendicular magnetization states, $V_{OUT}$ may be determined as follows:

$$V_{OUT} = V_{IN}\left(\frac{R-\Delta R}{2R-\Delta R} - \frac{R}{2R-\Delta R}\right) = V_{IN}\left(\frac{\Delta R}{2R-\Delta R}\right)$$

The output voltage produced when the unshielded MR elements 301 and 304 are in non-neutral magnetization states (e.g., parallel magnetization states) and the fixed MR elements 302 and 303 are in neutral magnetization states (e.g., perpendicular magnetization states) may be referred to herein as an "active sensor voltage."

As discussed previously, variations in an external magnetic field may be sufficient to change the state of an MR element (e.g., unshielded MR elements 301 and 304) from a neutral magnetization state to a non-neutral magnetization state. For the circuit illustrated in FIG. 3, this state change may result in a detectable change in the output voltage, $V_{OUT}$, from a neutral sensor voltage (e.g., when all MR elements are in perpendicular magnetization states) to an active sensor voltage (when some MR elements are in parallel magnetization states). For example, the detectable change in the output voltage may be from 0 V to $\Delta R/(2R-\Delta R)$ V, as explained above. For example, when $V_{IN}$=5 V, R=5 k$\Omega$, and $\Delta R$=500$\Omega$, $V_{OUT}$ may vary from a neutral sensor voltage of about 0 V to an active sensor voltage of about 260 millivolts (mV). In other embodiments, a detectable change in the output voltage may be indicated by different neutral sensor voltage and active sensor voltage values, which depend on the voltage differential across the MR sensor circuit, the configuration of the MR sensor circuit, the variance in the resistance (e.g., $\Delta R$) of each MR element between a neutral magnetization state and a non-neutral magnetization state, and/or the number of unshielded MR elements and shielded MR elements (if any) in the MR sensor circuit, among other things.

A single MR sensor, such as MR sensor 300 and other embodiments discussed herein, may be used to sense the presence or absence of an external magnetic field. In another embodiment, a plurality of MR sensors may be used to sense the presence or absence of an external magnetic field, by positioning the plurality of MR sensors in proximity to one another (e.g., in a planar array configuration), and by combining the output voltages of the plurality of MR sensors. As used herein, an "MR sensor array" includes a plurality of MR sensors positioned in physical proximity to each other. In an embodiment, output voltages generated by a plurality of MR sensors within an MR sensor array are combined together through additional circuitry, which will be discussed in more detail later.

Figure 4:
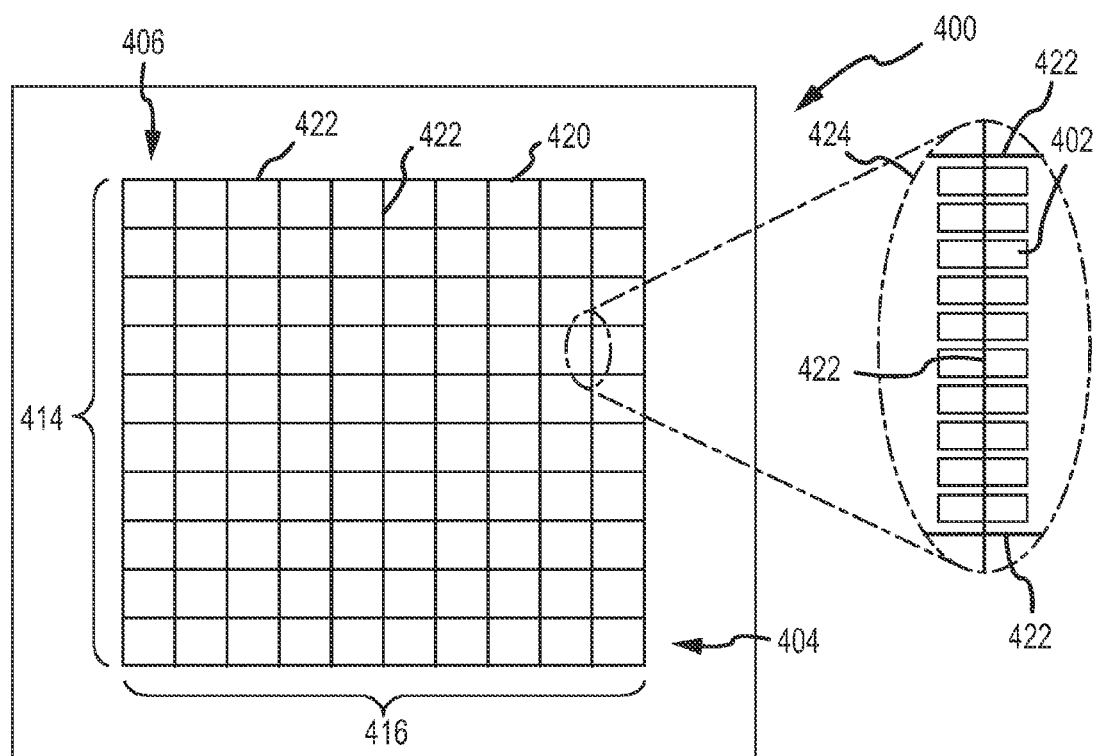
FIG. 4 illustrates a top view of a plurality of MR sensors forming an electromagnetic sensor array, in accordance with an example embodiment.

FIG. 4 illustrates a top view of a configuration for a plurality of MR sensors 402 forming an electromagnetic sensor array 400, in accordance with an example embodiment. Array 400 includes a plurality of MR sensors 402, arranged in rows 404 and columns 406, in an embodiment. Each MR sensor 402 includes at least one MR element with a resistance that is variable, based on the presence or absence of an external magnetic field. In an embodiment, each MR sensor 402 is adapted to produce an output voltage having a magnitude that varies, based on the presence or absence of an external magnetic field. Each MR sensor 402 may include, for example, an MR sensor such as that illustrated and described in conjunction with FIG. 3.

In an embodiment, MR sensors 402 are formed on a common substrate 408, such as an integrated circuit substrate, and may form a portion of a packaged device (e.g., a large scale integrated circuit or other device). MR sensors 402 may be formed, for example, on a substrate using conventional semiconductor manufacturing techniques. In an embodiment, each MR sensor 402 has a height and a width in a range of about 3-5 microns, although some or all MR sensors 402 may have larger or smaller dimensions, in other embodiments. An overall height 414 and width 416 of array 400 may be, for example, in a range of about 300-500 microns, in an embodiment, although the overall height 414 and width 416 may be larger or smaller, in other embodiments.

In an embodiment, array 400 also includes a structure 420 adapted to carry a magnetic field. For example, but not by way of limitation, structure 420 may include a mesh structure composed of a plurality of conductive wires or traces 422, a ground plane, a flux concentrator, and/or another type of structure that is adapted to carry a magnetic field and/or electric current. In an embodiment, structure 420 is positioned above the plurality of MR sensors 402, and functions to concentrate a magnetic field in proximity to the plurality of MR sensors 402. For example, as illustrated in exploded section 424, structure 422 may include a conductive wire or trace 422 positioned over MR sensors 402. An insulating layer (not illustrated) may be positioned between MR sensors 402 and structure 420, in an embodiment.

The illustrated array 400 includes a plurality of rows 404 and columns 406 of MR sensors 402. In various embodiments, an array may include M rows and N columns of MR sensors, where M and N may be equal or unequal, and may be integers between 10 and 1000. In other embodiments, an array may include more or fewer rows and/or columns. In still other embodiments, MR sensors 402 may be arranged in different patterns (e.g., concentric circles, staggered rows or other patterns) or may be arranged in an irregular configuration. Array 400 may be arranged in a substantially planar configuration, in an embodiment, meaning that the free magnetic layers (e.g., free magnetic layer 106, FIG. 1) of some or all of the unshielded MR elements (e.g., unshielded MR elements 301 and 304, FIG. 3) of array 400 are oriented facing a same direction and/or are substantially co-planar.

In an embodiment, each MR sensor 402 includes at least four terminals. Two of the terminals, referred to as "input terminals," are adapted to provide an input voltage (e.g., $V_{IN}$, FIG. 3) across the sensor. The other two terminals, referred to as "output terminals," are adapted to provide an output voltage (e.g., $V_{OUT}$, FIG. 3) from the sensor. In an embodiment, the output terminals of each MR sensor 402 may be electrically connected so that the plurality of output voltages may be combined in series to produce the array output signal. In other embodiments, the MR sensors 402 may be electrically connected in other configurations (e.g., in parallel configurations, and/or combinations of parallel/series configurations) to produce an array output signal. The array output signal may then be amplified, filtered, processed, and/or analyzed by other portions of a sensor system.

In an embodiment, one or more MR sensor arrays (e.g., array 400) may be incorporated into an electromagnetic sensor system. In such a system, the one or more MR sensor arrays may be positioned in proximity to a structure that is adapted to carry a magnetic field, and the one or more MR sensor arrays may produce time-varying array output signals that correspond to the time-varying nature of the magnetic field. For example, as will be described in more detail in conjunction with FIG. 6, one or more MR sensor arrays may be coupled with a flexible or non-flexible attachment means, such as an appliqué adapted to carry the one or more MR sensors and to hold them in position with respect to a structure (e.g., an exterior portion of an aircraft). In another embodiment, one or more MR sensor arrays may be incorporated into a radio frequency (RF) sensor system. In such a system, the one or more MR sensor arrays may be positioned (e.g., via an appliqué or other attachment means) in proximity to a structure that is adapted to carry a time-varying magnetic field, and the time-varying magnetic field may be produced by a time-varying RF signal that is incident on the structure. Accordingly, although an MR sensor array may be adapted to generate a time-varying array output signal that corresponds to a time-varying magnetic field, inclusion of a structure adapted to produce the time-varying magnetic field in response to an incident, time-varying RF signal yields an RF sensor system.

Figure 5:
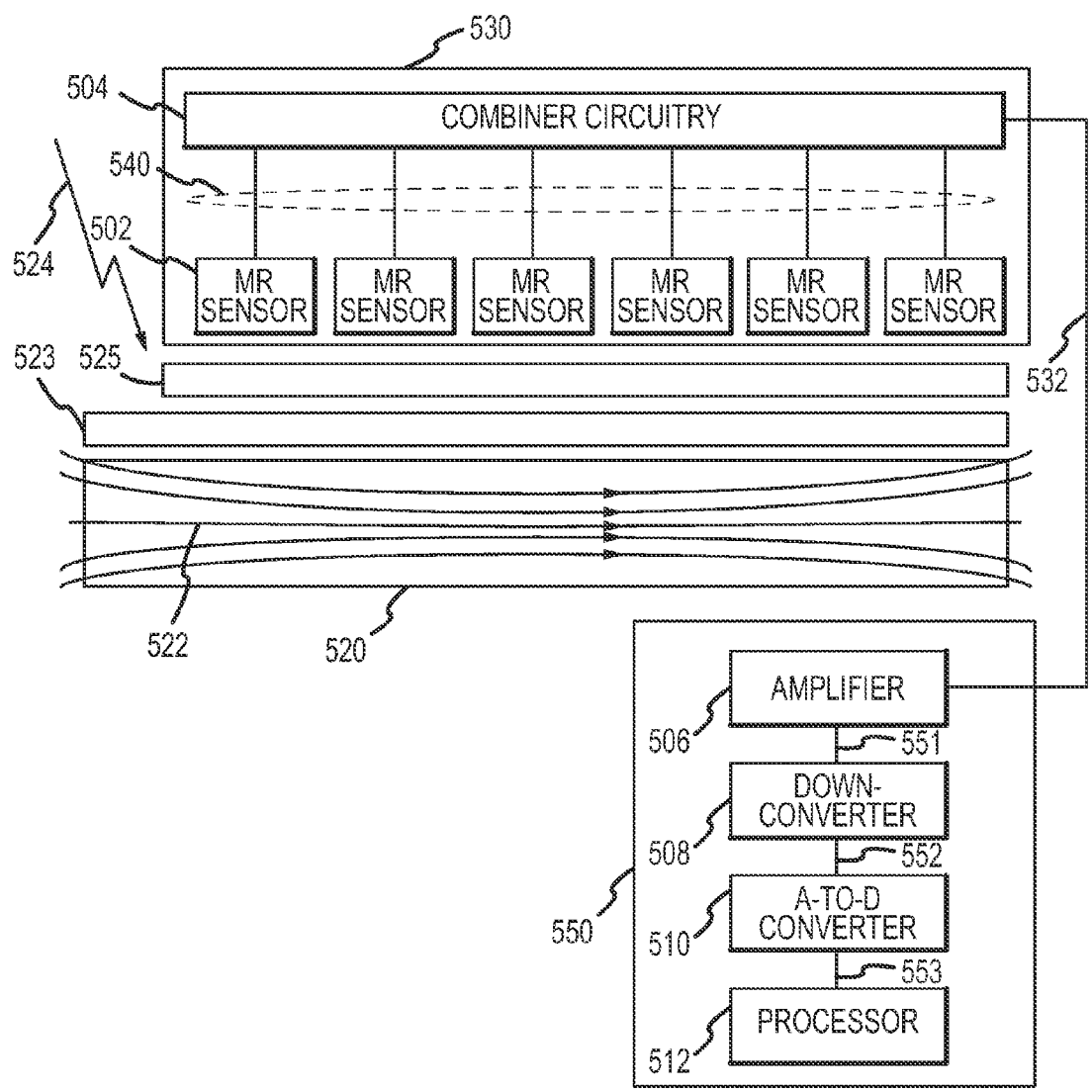
FIG. 5 illustrates a simplified block diagram of an RF sensor system, in accordance with an example embodiment.

FIG. 5 illustrates a simplified block diagram of an RF sensor system 500, in accordance with an example embodiment. RF sensor system 500 includes a plurality (e.g., an array) of MR sensors 502, combiner circuitry 504, amplifier 506 (e.g., a low noise amplifier), downconverter 508, analog-to-digital (A-to-D) converter 510, and at least one processor 512. Sensor system 500 may be deployed in proximity to a structure 520, which may function as a carrier of external magnetic field 522. For example, structure 520 may include an electrically conductive planar structure (e.g., a portion of an aircraft outer covering), a ground plane, and/or another type of structure that is adapted to carry an electric field. An insulator 523, such as an insulating film, may be applied between structure 520 and MR sensors 502. In addition, a flux concentrator 525 may be positioned between structure 520 and MR sensors 502. For example, flux concentrator 525 may include a structure adapted to carry and/or concentrate a magnetic field (e.g., structure 420, FIG. 4), in an embodiment. In other embodiments, flux concentrator 525 may include a collection of conductive wires or traces (e.g., a plurality of parallel and/or perpendicular wires or traces), a conductive mesh structure, and/or another type of structure that is adapted to concentrate a flux from a magnetic field. In still other embodiments, flux concentrator 525 may be excluded from the system. External magnetic field 522 may be produced in structure 520, in an embodiment, by a time-varying, external RF signal 524. For example, but not by way of limitation, external RF signal 524 may include a communications signal, a radar signal, and/or another type of broadband or narrow-band RF signal.

In an embodiment, a sensor portion 530 of sensor system 500 is adapted to produce an analog array output signal 532 based on external magnetic field 522 and/accordingly, based on the external RF signal 524 that produced external magnetic field 522. The sensor portion 530 includes the plurality of MR sensors 502, combiner circuitry 504, and various packaging and other electrical or structural components, in an embodiment. Six MR sensors 502 are shown in FIG. 5 for illustration purposes only, and sensor portion 530 may include more or fewer of MR sensors 502. The sensor portion 530 may also include routing circuitry electrically coupled to output terminals (e.g., terminals 314, 316, FIG. 3) of the MR sensors 502. In an embodiment, the routing circuitry is adapted to enable the plurality of time-varying output voltages generated by MR sensors 502 to be combined.

The sensor portion 530 may be deployed so that MR sensors 502 are magnetically coupled to structure 520. For example, in a particular application, the sensor portion 530 may be deployed in contact with an external surface of an aircraft's outer covering, and/or another structure (e.g., flux concentrator 525 and/or insulator 523) attached to the external surface. When external RF signal 524 is incident upon structure 520, external magnetic field 522 may be produced within structure 520 and, if it is present, flux concentrator 525. When a magnitude of external magnetic field 522 is sufficiently large, some or all of MR sensors 502 may change from a neutral magnetization state to a non-neutral magnetization state. Accordingly, some or all of MR sensors 502 may produce sensor output voltages 540, which represent active sensor voltages. In an embodiment, each of the active sensor voltages 540 may be combined by combiner circuitry 506 to produce the analog array output signal 532, which is carried by a signal conductor to processing portion 550. In an embodiment, the sensor portion 530 may be positioned over a first side of structure 520 (e.g., an exterior side) and processing portion 550 may be positioned elsewhere (e.g., under an interior side of structure 520). The signal conductor adapted to carry the array output signal 532 may extend through a relatively small penetration in structure 520.

A processing portion 550 of sensor system 500 may be adapted to amplify, process, and/or analyze the analog array output signal 532. The processing portion 550 includes amplifier 506, downconverter 508, A-to-D converter 510, and the at least one processor 512, in an embodiment. The processing portion 550 may be deployed in proximity to or remotely from the sensor portion 530. For example, in the aircraft example described above, processing portion 550 may be deployed in an interior portion of the aircraft, such as in an interior cavity below the aircraft outer covering or in a remote location (e.g., the cockpit).

Amplifier 506 may include, for example, a low noise amplifier. Amplifier 506 is adapted to amplify the analog array output signal 532 to produce an amplified, array output signal 551. Downconverter 508 is adapted to receive and downconvert the amplified array output signal 551. In various embodiments, downconverter 508 may convert the amplified array output signal 551 to an intermediate frequency or to baseband. A-to-D converter 510 is adapted to receive the downconverted array output signal 552, and to convert the signal into a digital array output signal 554. The at least one processor 512 is adapted to receive and process the digital array output signal 554. Processing may include, for example but not by way of limitation, extracting information from the digital array output signal 554, packetizing and/or routing information contained within the digital array output signal 554, generating other information based on the presence/absence and/or content of the digital array output signal 554, displaying and/or storing information relating to the digital array output signal 554, and/or otherwise processing the digital array output signal 554.

As mentioned previously, a sensor portion (e.g., sensor portion 530) of a sensor system may be deployed so that its associated MR sensors (e.g., MR sensors 502) are magnetically coupled to a structure (e.g., structure 520). Along with magnetic coupling, it may be desirable to physically couple the sensor portion to the structure. Physical coupling may be done in several different ways. In a particular embodiment, one or more sensor portions and/or sensor arrays may form a portion of an appliqué, which may be physically coupled, adhered, or otherwise attached to a structure. As used herein, the term "appliqué" refers to a combination of one or more MR sensor portions (e.g., MR sensor arrays) with a means for carrying and physically coupling the one or more sensor portions to a structure.

Figure 6:
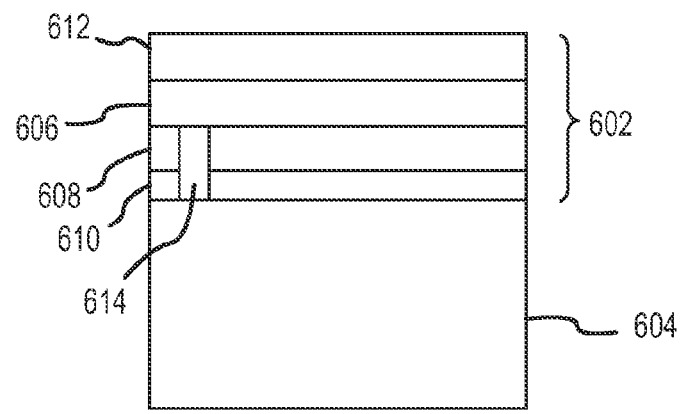
FIG. 6 illustrates a simplified, cross-sectional, side view of a portion of an appliqué-implementation of an RF sensor, in accordance with an example embodiment.

FIG. 6 illustrates a simplified, cross-sectional, side view of a portion of an appliqué-implemented MR sensor 602 physically coupled with a structure 604, in accordance with an example embodiment. Structure 604 may include, for example, a structure adapted to carry a magnetic field, such as a conductive ground plane forming a portion of an outer covering of an aircraft, for example. Appliqué-implemented MR sensor 602 includes an MR sensor array layer 606, a contact layer 608, an adhesive layer 610, and an exterior layer 612, in an embodiment. Each of the various layers 606, 608, 610, 612 of appliqué-implemented MR sensor 602 may be flexible or rigid, in various embodiments. When all of layers 606, 608, 610, 612 are flexible, appliqué-implemented MR sensor 602 may be conformable to a surface of structure 604.

MR sensor array layer 606 includes one or more MR sensor arrays (e.g., MR sensor array 400, FIG. 4), in an embodiment, each of which may be formed on a distinct substrate. When MR sensor array layer 606 includes multiple MR sensor arrays, outputs of the multiple MR sensor arrays may be electrically coupled together (e.g., in series, parallel, or a combined arrangement), in an embodiment, to produce a single sensor output from the multiple MR sensor arrays.

Exterior layer 612 may be coupled to one side of MR sensor array layer 606, in an embodiment. Exterior layer 612 is adapted to protect MR sensor array layer 606 from physical and/or environmental damage that may otherwise occur if MR sensor array layer 606 were exposed to the environment. In addition, exterior layer 612 may function as a carrier of the one or more MR sensor arrays of MR sensor array layer 606. In an embodiment, exterior layer 612 may be formed from one or more films or layers of durable, insulating material, such as, for example, polyurethane and/or other suitable materials.

Contact layer 608 may be physically coupled to an opposite side of MR sensor array layer 606 from exterior layer 612. In an embodiment, contact layer 608 is adapted to provide electrical insulation between MR sensor array layer 606 and structure 604. Contact layer 608 may include, for example, one or more films or layers of insulating material, such as, for example, polyurethane, polyetheretherketone (PEEK), and/or other insulating films or layers. Adhesive layer 610 is adapted to enable appliqué-implemented MR sensor 602 to be adhered to structure 604. In an embodiment, adhesive layer 610 includes a pressure-sensitive adhesive distributed over the surface of contact layer 608.

In an embodiment, appliqué-implemented MR sensor 602 also may include one or more electrical contacts 614, adapted to provide electrical conductivity between structure 604 and MR sensor array layer 606. In various embodiments, electrical contacts 614 may include one or more "fuzz buttons," conductive vias, or other electrically conductive structures.

In an embodiment, a single sensor array may be deployed to sense a time-varying magnetic field, which is responsive to a time-varying RF signal. In another embodiment, multiple sensor arrays may be deployed to sense a time-varying magnetic field, and the outputs from the multiple sensor arrays may be combined, within a sensor system. For example, multiple sensor arrays may be deployed in close proximity to each other and/or in remote locations, and their outputs may be combined and processed by a sensor system. In an aircraft application, for example, sensor arrays may be deployed at various locations on the aircraft, and their outputs may be transmitted to a common processing portion of the sensor system.

Figure 7:
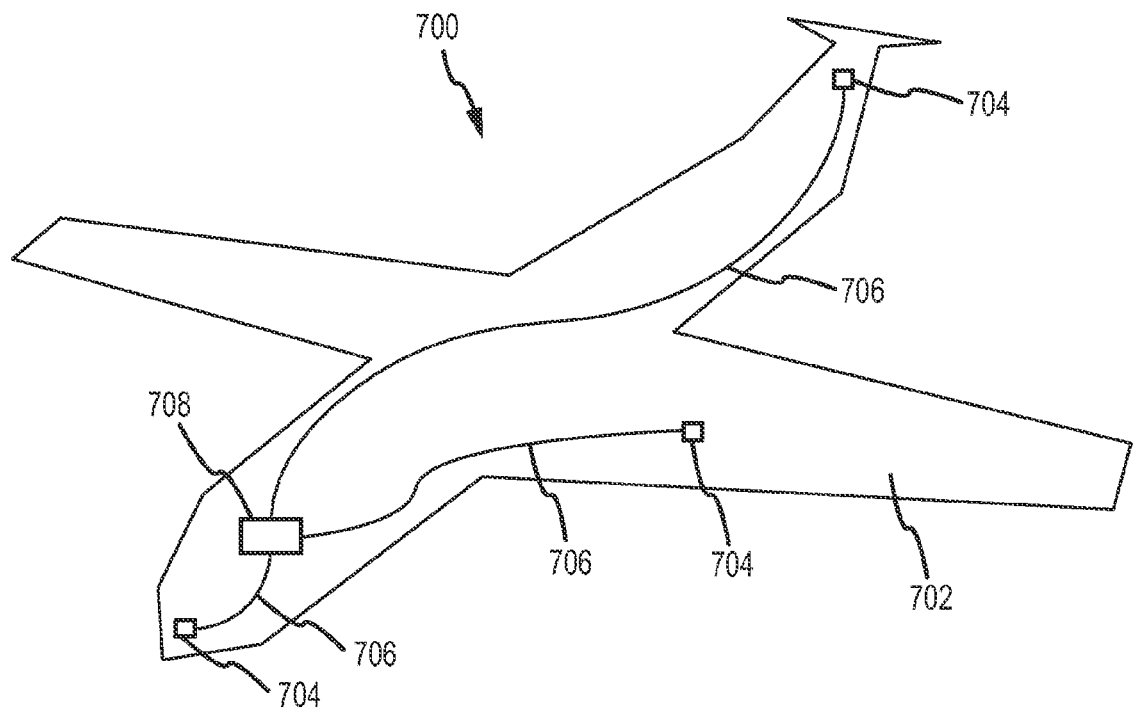
FIG. 7 illustrates a perspective view of an RF sensor system deployed on an aircraft, in accordance with an example embodiment.

FIG. 7 illustrates a perspective view of an RF sensor system 700 deployed on an aircraft 702, in accordance with an example embodiment. RF sensor system 700 includes a plurality of sensor arrays 704, which are positioned at various locations on aircraft 702. One or more sensor arrays 704 may be deployed at each location, for example. Array output signals (e.g., analog array output signal 532, FIG. 5) may then be transmitted, via wired, wireless (e.g., RF) and/or optical connections 706, to one or more processing portions 708 (e.g., processing portion 550, FIG. 5) of RF sensor system 700. The one or more processing portions may combine and/or correlate the received array output signals, and may perform other functions, as well. For example, the one or more processing portions may be located in proximity to the aircraft cockpit.

Figure 8:
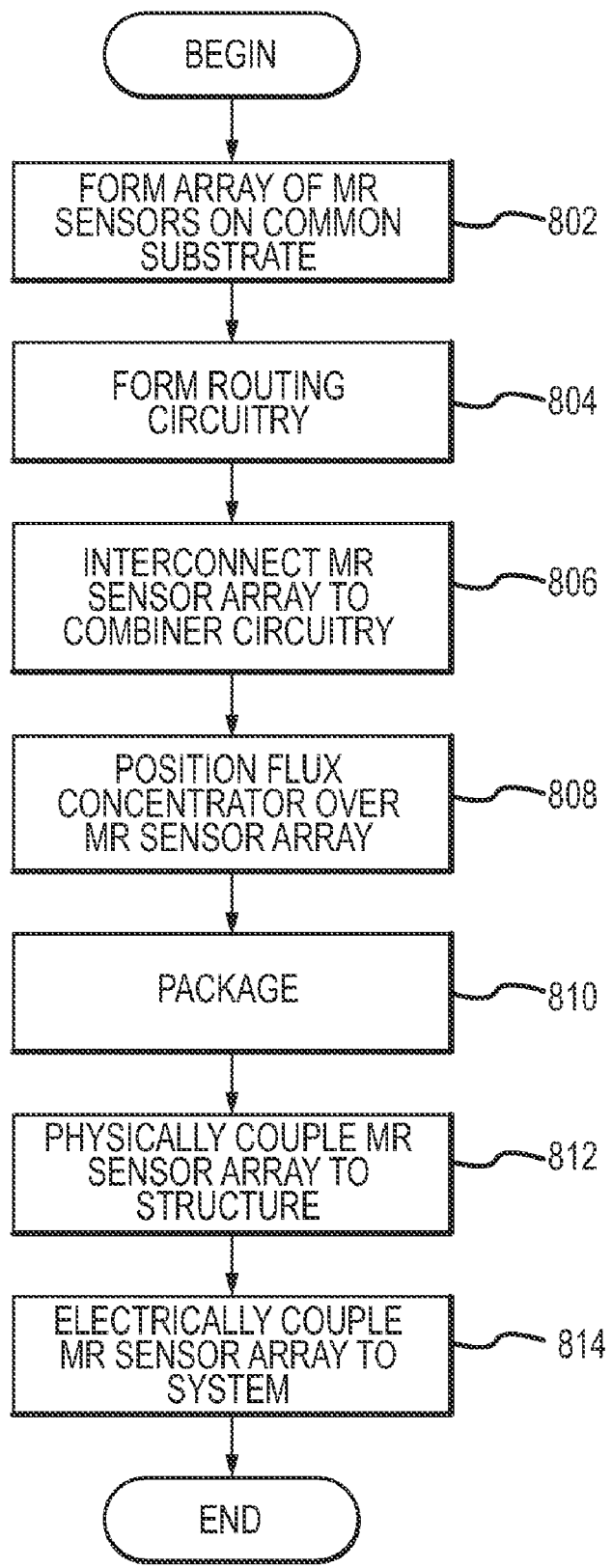
FIG. 8 illustrates a flowchart of a method for manufacturing and deploying an RF sensor system, in accordance with an example embodiment.

FIG. 8 illustrates a flowchart of a method for manufacturing and deploying an RF sensor system, in accordance with an example embodiment. The method may begin, in block 802, by forming an array of MR sensors (e.g., array 400 of MR sensors 402, FIG. 4) on a common substrate (e.g., substrate 408, FIG. 4). The MR sensor array may be manufactured using conventional integrated circuit manufacturing techniques. Manufacturing may include forming (e.g., through one or more deposition and etching processes) a plurality of multi-layer structures, each of which may form an MR sensor circuit, such as a Wheatstone bridge circuit (e.g., circuit 300, FIG. 3). In an embodiment, the multi-layer structure may include at least one layer that includes pinned ferromagnetic elements (e.g., first ferromagnetic layer 102, FIG. 1), at least one non-ferromagnetic layer (e.g., non-ferromagnetic layer 104, FIG. 1), and at least one layer that includes free ferromagnetic elements (e.g., second ferromagnetic layer 106, FIG. 1). In addition, the multi-layer structure may include at least one permanent magnetic layer in proximity to the pinned ferromagnetic elements, which is adapted to pin the magnetic axes of the pinned ferromagnetic elements in a fixed direction.

In block 804, routing circuitry may be formed over the plurality of MR sensors, where the routing circuitry includes one or more layers of conductive traces electrically coupled to output terminals (e.g., terminals 314, 316, FIG. 3) of the plurality of MR sensors. In an embodiment, the routing circuitry is adapted to enable the plurality of time-varying output voltages generated by the plurality of MR sensors to be combined. The routing circuitry may also include one or more layers having conductive traces for carrying power, ground, and other signals, among other things.

In an embodiment, manufacturing may also include interconnecting the MR sensor array to combiner circuitry, in block 806, which is adapted to combine the outputs of the MR sensors received via the routing circuitry. In block 808, a flux concentrator structure (e.g., structure 420, FIG. 4) may be positioned over the MR sensor array and/or the combiner circuitry. In block 810, the MR sensor array may be packaged in an integrated circuit package (e.g., a large scale integrated circuit package), in an embodiment, using conventional integrated circuit packaging techniques.

In block 812, one or more of the MR sensor arrays may be physically coupled to a structure adapted to carry a time-varying magnetic field. For example, the MR sensor array may be coupled to an appliqué or other apparatus, which is in turn physically coupled over the structure (e.g., structure 520, FIG. 5). In an embodiment, an insulating layer (e.g., insulating layer 523, FIG. 5) may be positioned between the MR sensor array and the structure. To couple an MR sensor array over the structure, the MR sensor array is oriented, with respect to the structure, so that the unshielded MR elements (e.g., MR elements 301, 304, FIG. 3) are magnetically coupled to the structure. The MR sensor array may then be secured to the structure using an appliqué (as mentioned previously), or alternatively using braces, adhesives, and/or other coupling mechanisms.

In block 814, the MR sensor array is electrically coupled to other portions of the RF system. For example, electrical, optical, and/or RF connectors may be coupled between the MR sensor array and other portions of the RF system (e.g., processing portion 550, FIG. 5). The method may then end.

Embodiments of RF sensor systems, electromagnetic sensor arrays, and methods of their manufacture have been described. An example embodiment includes an RF sensor system having a plurality of MR sensors, where each MR sensor includes a configuration of MR elements and is adapted to produce a time-varying output voltage in response to a time-varying, external magnetic field. The RF sensor system also includes combiner circuitry, electrically coupled to the plurality of MR sensors, and adapted to receive and combine a plurality of time-varying output voltages from the plurality of MR sensors to generate a sensor output voltage. Another example embodiment includes an electromagnetic sensor array having a plurality of MR sensors arranged in an array configuration, where each MR sensor includes a plurality of MR elements forming a Wheatstone bridge circuit, and where each MR sensor is adapted to produce a time-varying output voltage in response to a time-varying, external magnetic field. Still another example embodiment includes a method for manufacturing an electromagnetic sensor array that includes the step of forming, on a semiconductor substrate, a plurality of MR sensors, where each MR sensor includes a configuration of MR elements and is adapted to produce a time-varying output voltage in response to a time-varying, external magnetic field. The method also includes the step of forming routing circuitry, over the plurality of MR sensors, where the routing circuitry is electrically coupled to output terminals of the plurality of MR sensors, and enables a plurality of time-varying output voltages generated by the plurality of MR sensors to be combined.

Embodiments of the inventive subject matter may have one or more advantages over conventional antenna systems. For example, embodiments of the inventive subject matter may provide electromagnetic sensor arrays that may be scaled to significantly smaller dimensions than traditional phased array, SAW-based, or monopole-based antennas, irrespective of the bandwidth. In addition, the inherently mismatched operation of the MR elements incorporated into the various embodiments substantially eliminates drawing power from the illuminating field (e.g., the system ground plane). Accordingly, an electromagnetic sensor array according to an embodiment may be significantly smaller than a conventional antenna, and accordingly may be installed in a significantly smaller area, have a lower physical profile, and/or may weigh substantially less than a conventional antenna.

Examples of MR sensor arrays and MR sensor systems used in conjunction with aircraft have been given, above. These examples are not meant to limit application of the inventive subject matter to aircraft. Instead, MR sensor arrays and MR sensor systems of various embodiments may be used in a wide range of applications. While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the described embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

What is claimed is:

1. A radio frequency (RF) sensor system comprising:
a plurality of magnetoresistive sensors, wherein each magnetoresistive sensor includes a configuration of magnetoresistive elements and is adapted to produce a time-varying output voltage in response to a time-varying, external magnetic field;
combiner circuitry, electrically coupled to the plurality of magnetoresistive sensors, and adapted to receive and combine a plurality of time-varying output voltages from the plurality of magnetoresistive sensors to generate a sensor output voltage; and
a structure, magnetically coupled to the plurality of magnetoresistive sensors, and adapted to carry the time-varying, external magnetic field in response to an RF signal incident upon the structure.

2. The RF sensor system of claim 1, wherein the configuration of magnetoresistive elements includes a configuration of giant magnetoresistive elements.

3. The RF sensor system of claim 1, wherein the configuration of magnetoresistive elements includes a Wheatstone bridge circuit that includes at least four magnetoresistive elements forming resistive elements of the Wheatstone bridge circuit.

4. The RF sensor system of claim 3, wherein the at least four magnetoresistive elements include at least one shielded magnetoresistive element.

5. The RF sensor system of claim 1, wherein the plurality of magnetoresistive sensors includes an array of magnetoresistive sensors.

6. The RF sensor system of claim 1, wherein the combiner circuitry is configured to combine at least some of the plurality of time-varying output voltages in series to produce the sensor output voltage.

7. The RF sensor system of claim 6, further comprising:
an amplifier, electrically coupled to the combiner circuitry, and adapted to amplify the sensor output voltage.

8. The RF sensor system of claim 1, wherein the plurality of magnetoresistive sensors are formed on a semiconductor substrate.

9. The RF sensor system of claim 1, wherein the structure comprises a conductive mesh structure.

10. The RF sensor system of claim 1, wherein the structure comprises a conductive ground plane, magnetically coupled to the plurality of magnetoresistive sensors, and adapted to carry the time-varying, external magnetic field in response to an RF signal incident upon the conductive ground plane.

11. The RF sensor system of claim 10, wherein the conductive ground plane forms a portion of an outer covering of an aircraft.

12. The RF sensor system of claim 1, wherein the plurality of magnetoresistive sensors and the combiner circuitry form a portion of a magnetoresistive sensor array level, and wherein the RF sensor system further comprises:
an exterior layer, coupled to a first side of the magnetoresistive sensor array layer, wherein the exterior layer is adapted to protect the magnetoresistive sensor array layer;
a contact layer, coupled to a second side of the magnetoresistive sensor array layer, wherein the contact layer is adapted to electrically insulate the magnetoresistive sensor array layer; and
an adhesive layer, coupled to the contact layer, wherein the adhesive layer is adapted to enable the RF sensor system to be adhered to a structure.

13. An electromagnetic sensor array comprising:
a plurality of magnetoresistive sensors arranged in an array configuration, wherein each magnetoresistive sensor includes a plurality of magnetoresistive elements forming a Wheatstone bridge circuit, and wherein each magnetoresistive sensor is adapted to produce a time-varying output voltage in response to a time-varying, external magnetic field and
a structure, magnetically coupled to the plurality of magnetoresistive sensors, and adapted to carry the time-varying, external magnetic field in response to an RF signal incident upon the structure.

14. The electromagnetic sensor array of claim 13, wherein the Wheatstone bridge circuit comprises:
a first resistance leg comprising a first unshielded magnetoresistive element and a first shielded magnetoresistive element electrically coupled in series; and a second resistance leg, electrically coupled in parallel to the first resistance leg, and comprising a second unshielded magnetoresistive element and a second shielded magnetoresistive element electrically coupled in series.

15. The electromagnetic sensor array of claim 13, further comprising:
routing circuitry, electrically coupled to output terminals of the plurality of magnetoresistive sensors, and adapted to enable a plurality of time-varying output voltages generated by the plurality of magnetoresistive sensors to be combined.

16. The electromagnetic sensor array of claim 13, further comprising:
combiner circuitry, electrically coupled to the plurality of magnetoresistive sensors, and adapted to receive and combine a plurality of time-varying output voltages from the plurality of magnetoresistive sensors to generate a sensor output voltage.

17. The electromagnetic sensor array of claim 16, further comprising:
an amplifier, electrically coupled to the combiner circuitry, and adapted to amplify the sensor output voltage.

18. A method for manufacturing an electromagnetic sensor array comprising the steps of:
forming, on a semiconductor substrate, a plurality of magnetoresistive sensors, wherein each magnetoresistive sensor includes a configuration of magnetoresistive elements and is adapted to produce a time-varying output voltage in response to a time-varying, external magnetic field;
forming routing circuitry, over the plurality of magnetoresistive sensors, wherein the routing circuitry is electrically coupled to output terminals of the plurality of magnetoresistive sensors, and enables a plurality of time-varying output voltages generated by the plurality of magnetoresistive sensors to be combine; and
physically coupling the electromagnetic sensor array to a structure adapted to carry the time-varying, external magnetic field in response to an RF signal incident upon the structure.

19. The method of claim 18, wherein forming the plurality of magnetoresistive sensors comprises:
forming each of the plurality of magnetoresistive sensors as a Wheatstone bridge circuit that includes
a first resistance leg comprising a first unshielded magnetoresistive element and a first shielded magnetoresistive element electrically coupled in series, and
a second resistance leg, electrically coupled in parallel to the first resistance leg, and comprising a second unshielded magnetoresistive element and a second shielded magnetoresistive element electrically coupled in series.

20. The method of claim 18, further comprising:
packaging the electromagnetic sensor array as a large scale integrated circuit.

* * * * *